(12) United States Patent
Wu et al.

(10) Patent No.: US 9,514,845 B1
(45) Date of Patent: Dec. 6, 2016

(54) CHECK AFTER WRITE FOR ASSESSING WEAR RELATED DEGRADATION IN SOLID STATE STORAGE

(71) Applicant: SK Hynix Inc., Gyeonggi-do (KR)

(72) Inventors: Zheng Wu, San Jose, CA (US); Jason Bellorado, San Jose, CA (US); Arunkumar Subramanian, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 128 days.

(21) Appl. No.: 14/534,638

(22) Filed: Nov. 6, 2014

Related U.S. Application Data (60) Provisional application No. 61/915,355, filed on Dec. 12, 2013.

(51) Int. Cl.
| | | |
|---|---|---|
| *G06F 11/00* | (2006.01) | |
| *G11C 29/42* | (2006.01) | |
| *G11C 29/44* | (2006.01) | |
| *G06F 11/10* | (2006.01) | |

(52) U.S. Cl.
CPC ........... *G11C 29/42* (2013.01); *G06F 11/1004* (2013.01); *G11C 29/44* (2013.01)

(58) Field of Classification Search
CPC ....... G11C 29/42; G11C 29/44; G06F 11/1004
See application file for complete search history.

(56) References Cited

U.S. PATENT DOCUMENTS

| | | | | |
|---|---|---|---|---|
| 6,081,447 A * | 6/2000 | Lofgren | ............. | G06F 12/0246 365/185.02 |
| 6,116,275 A * | 9/2000 | George, Jr. | ............. | F16L 21/08 111/118 |
| 7,542,350 B2 * | 6/2009 | Park | ..................... | G11C 16/349 365/185.24 |
| 7,808,834 B1 * | 10/2010 | Sutardja | ............. | G11C 16/3418 365/185.11 |
| 8,213,229 B2 * | 7/2012 | Wilson | ............... | G06F 11/1068 365/185.09 |
| 8,464,106 B2 * | 6/2013 | Filor | ..................... | G06F 11/004 714/723 |
| 8,516,343 B2 * | 8/2013 | Flynn | .................... | G06F 11/108 714/773 |
| 8,583,855 B2 * | 11/2013 | Yoo | ..................... | G06F 12/0246 711/103 |
| 8,638,602 B1 * | 1/2014 | Horn | .................... | G11C 29/021 365/185.03 |
| 9,063,874 B2 * | 6/2015 | Zhong | ................. | G06F 12/0246 |
| 9,070,481 B1 * | 6/2015 | Ellis | ...................... | G11C 29/50 |
| 9,164,892 B2 * | 10/2015 | Oh | | |

* cited by examiner

*Primary Examiner* — Esaw Abraham
(74) *Attorney, Agent, or Firm* — IP & T Group LLP (57) ABSTRACT

A group of one or more solid state storage cells is programmed. A predetermined amount of time after the group of solid state storage cells is programmed, the group of solid state storage cells is read to obtain read data. Error correction decoding is performed on the read data and the group of solid state storage cells is assessed for wear related degradation based at least in part on the error correction decoding.

14 Claims, 5 Drawing Sheets

CHECK AFTER WRITE FOR ASSESSING WEAR RELATED DEGRADATION IN SOLID STATE STORAGE

CROSS REFERENCE TO OTHER APPLICATIONS

This application claims priority to U.S. Provisional Patent Application No. 61/915,355 entitled PROGRESSIVE BACKGROUND MEDIA SCAN filed Dec. 12, 2013 which is incorporated herein by reference for all purposes.

BACKGROUND OF THE INVENTION

In solid state systems, errors contained in read-back data may correspond to a variety of error types and/or error sources. New techniques which can better differentiate between the different error types and/or error sources would be desirable so that an improved response can be taken for that particular error type or error source than was previously able to be performed.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
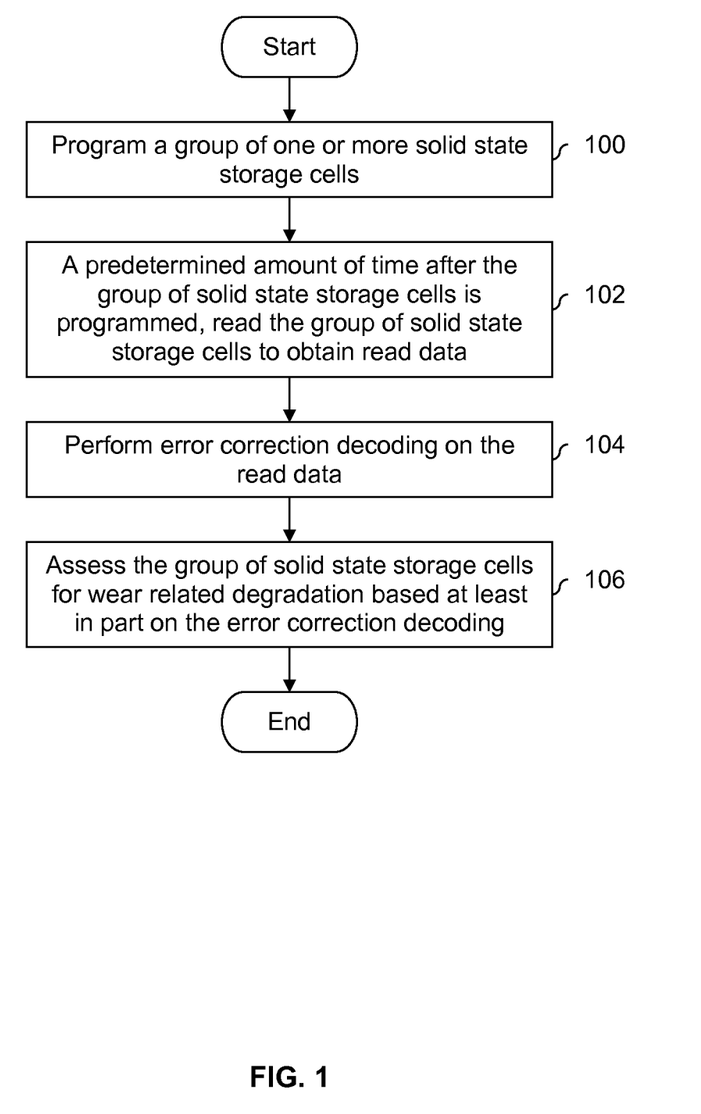
FIG. 1 is a flowchart illustrating an embodiment of a process for performing a check after write (CAW) process.

FIG. 1 is a flowchart illustrating an embodiment of a process for performing a check after write (CAW) process. In some embodiments, the process is performed by a storage controller implemented on a semiconductor device (e.g., an application-specific integrated circuit (ASIC) or a field-programmable gate array (FPGA)). In some embodiments, the CAW process shown is only performed on certain groups of cells, for example those that have failed some other check or test, such as a background media scan (BGMS). This may mitigate the number of CAW-initiated accesses to solid state storage, since each access has a cost associated with it (e.g., contributes to read disturb, blocks a host-initiated access, consumes I/O resources between the storage controller and solid state storage, etc.).

At 100, a group of one or more solid state storage cells is programmed. As used herein, a program may also be referred to as a write. In some embodiments, the group of cells comprises a block. In some embodiments, the group of cells comprises a superblock. In some embodiments, the program performed at step 100 is a host-initiated program of the solid state storage. To put it another way, in some embodiments a CAW "piggybacks" off of a host-initiated write to the targeted group of cells. This may mitigate the number of extra or additional accesses to the solid state storage.

At 102, a predetermined amount of time after the group of solid state storage cells is programmed, the group of solid state storage cells is read to obtain read data. In some embodiments, the predetermined amount of time occurs immediately after the write and the CAW is referred to as an immediate check after write (ICAW). In some other embodiments, the system waits some non-zero, specified amount of time after programming before performing the read. In some cases, it may take some time for observable results to manifest themselves, and so a non-zero wait time may be desired. As will be described in more detail below, the predetermined amount of time is relatively short in order to be able to differentiate between errors that result (at least partially) from wear related degradation (e.g., where the electrical insulation is poor) as opposed to other error sources (e.g., retention and read disturb). As used herein, retention is a problem where a group of solid state storage cells sits for a relatively long time without being refreshed and thus loses charge. When the group of cells is read back, there are errors because of the lost charge. Retention affects both cells with little wear and cells with heavy wear.

In some embodiments, the read at step 102 uses a default read threshold, for example, which is set by the manufacturer at the factory. In some embodiments, a non-default read threshold is used to perform a read at step 102. For example, an optimal read threshold which returns the fewest bit errors compared to all other read thresholds may be used at step 102. Generally speaking, a read threshold affects the read data. In the case of single-level cell (SLC) storage where each cell stores a single bit, if the stored voltage of a cell is less than the read threshold, then a 1 is read. If the stored voltage of a cell is greater than the read threshold, then a 0 is read. Obviously, the selection of the read threshold affects the read data. In some embodiments, an optimal read threshold has been exhaustively and empirically proven to be the read threshold which returns the fewest bit errors. In some embodiments, an optimal read threshold is an estimate which has not necessarily been exhaustively and/or empirically proven to be the read threshold which returns the fewest bit errors. Any appropriate technique to find or estimate an optimal read threshold may be used.

At 104, error correction decoding is performed on the read data to obtain a number of bit errors in the read data. Error correction decoding performed at step 104 has two outcomes (for this explanation, a third scenario of a miscorrection is not considered). In a first scenario, the decoder is able to successfully decode the read data because the error correction capability of the code has not been exceeded (i.e., the number of errors in the read data is less than or equal to the maximum number of errors the code is capable of correcting). In a second scenario, the decoder is unsuccessful at step 104 because the number of errors in the read data is greater than the maximum number of errors the code is capable of correcting. To put it another way, the decoder does not know exactly how many errors there are, or where they are located, merely that the number of errors is beyond the error correction capability of the code.

At 106, the group of solid state storage cells is assessed for wear related degradation based at least in part on the error correction decoding. In some embodiments, the assessment includes comparing the number of bit errors to some threshold (if error correction decoding is successful), where the specific threshold used depends upon what state the system is in.

In some embodiments, if decoding is successful at step 104, step 106 includes comparing the number of bit errors (e.g., found in the read data by the decoder) to an error threshold. In some such embodiments, if the number of bit errors is greater than or equal to the error threshold, then it is determined that the group of solid state storage cells has experienced some wear related degradation (e.g., and goes from a low wear state to a medium wear state, or from a medium wear state to a high wear state). However, if the number of bit errors is less than the error threshold, then it is determined that the group of solid state storage cells has experienced no (additional) wear related degradation (e.g., and the group of cells remains in whatever wear state it was in before).

In some embodiments, if decoding at step 104 is unsuccessful (i.e., because the error correction capability of the code was exceeded), then at step 106 it is determined that the group of solid state storage cells has experienced some wear related degradation (e.g., and the group of cells goes from a low wear state to a medium wear state, or from a medium wear state to a high wear state). Although the precise number of bit errors is not known, it is higher than the error correction capability of the code and is thus relatively high.

One benefit of the process shown in FIG. 1 is that it can differentiate between noise which comes from wear related degradation (e.g., which cannot be improved by refreshing a group of cells) and other noise sources (e.g., which can be improved by refreshing a group of cells). For example, a BGMS can identify groups of cells that have more errors than some error threshold, but the BGMS cannot differentiate between a "good" group of cells which has sat there for an exceptionally long time without being refreshed and a "leaky" group of cells which was programmed relatively recently but has leaked a relatively large amount of charge because of wear related degradation. Although the BGMS cannot differentiate between those two cases, the CAW process of FIG. 1 is able to differentiate between the two. The following figure illustrates an example of this.

Figure 2:
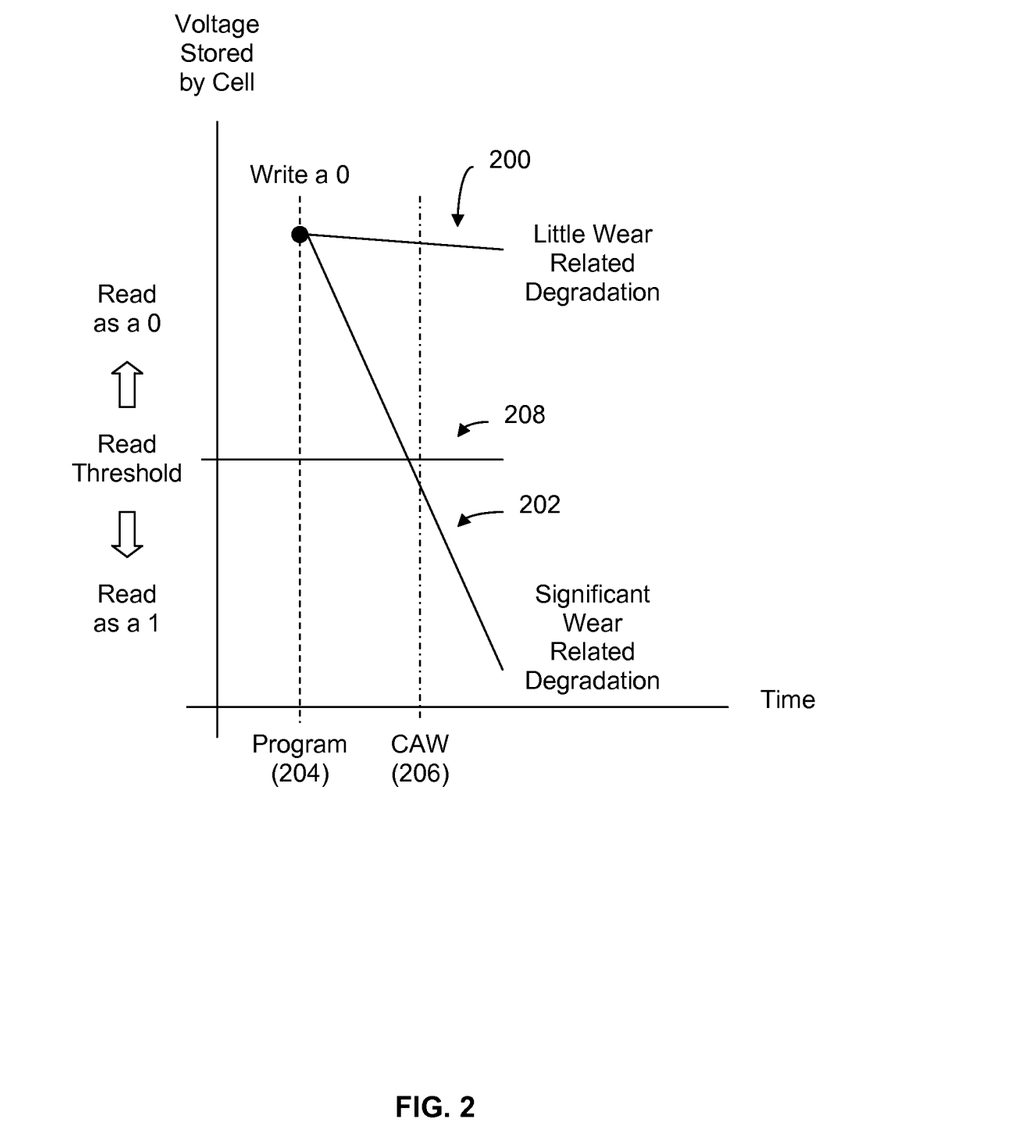
FIG. 2 is a diagram illustrating an embodiment of leakage for a cell with little wear related degradation and for a cell with significant wear related degradation.

FIG. 2 is a diagram illustrating an embodiment of leakage for a cell with little wear related degradation and for a cell with significant wear related degradation. The example shown is meant to be illustrative and is not to scale.

Programming and erasing causes the electrical insulation of a cell to break down. As such, a cell (or group of cells) with a high P/E count will tend to be much "leakier" than a cell (or group of cells) with a low P/E count. In the example shown, line 202 has a steeper slope than line 200 because line 202 corresponds to a cell with significant wear related degradation (i.e., it has a high P/E count and is leaky) and line 200 corresponds to a cell with little wear related degradation (i.e., it has a low P/E count and is not very leaky).

In the example shown, a program is performed at time 204. In this example, a 0 value is programmed. A check after write is performed at time 206. For line 202, because of the significant amount of wear related degradation, the voltage stored by the cell at time 206 has dropped below read threshold 208. As such, it is read as a 1, which is an error. In contrast, because the slope of line 200 is not as steep, the voltage stored by the cell at time 206 is greater than read threshold 208 and so no error is returned by the read.

As can be imagined, these read-back errors add up over all of the cells in a group of cells and so a group of cells with significant wear related degradation will have (significantly) more bit errors than a group of cells with little wear related degradation. The process of FIG. 1 is therefore able to differentiate between groups of cells with different amounts or degrees of wear related degradation whereas some other tests (e.g., BGMS) cannot do so. To put it another way, a system which only performs BGMS may be able to refresh data in a given group of cells by moving it to a new location, but it cannot know when to retire a given location. In contrast, a system which performs the process of FIG. 1 knows which block to retire and when to retire that location.

Figure 3:
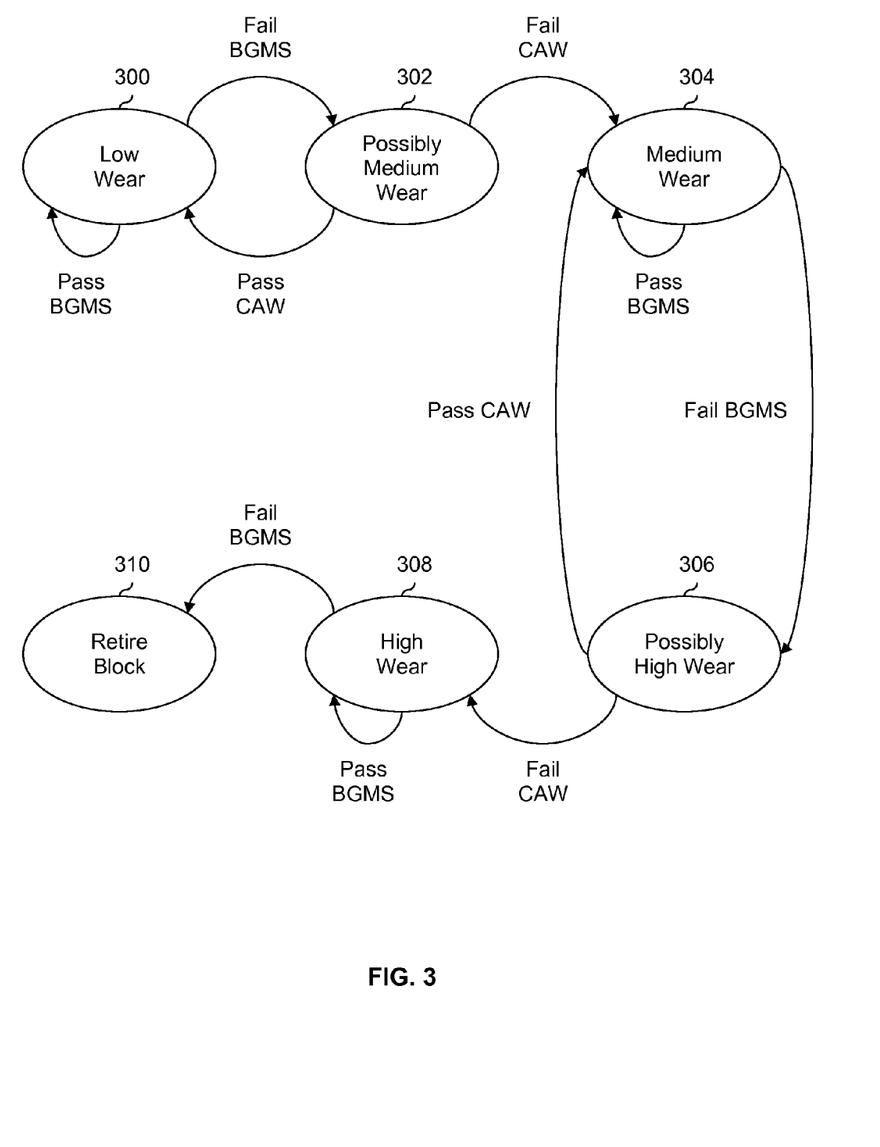
FIG. 3 is a diagram illustrating an embodiment of a state machine associated with solid state storage testing.

The following figure shows a state machine which uses the CAW process described in FIG. 1.

FIG. 3 is a diagram illustrating an embodiment of a state machine associated with solid state storage testing. In the example shown, the testing includes background media scan (BGMS) testing and CAW testing; the states shown are the states through which a group of cells (e.g., a block or a superblock) in solid state storage progresses. Note that one group of cells in solid state storage may be in one state and another group of cells may be in another state. In this example, the system knows what state a given group of cells is in based on 3 bits: the check flag (CF) bit, the default fail (DF) bit, and the end-of-life (EOL) bit. Table 1 (below) shows the values of those 3 bits for the states shown in FIG. 3.

TABLE 1

States from FIG. 3

| State Name | CF Bit | DF Bit | EOL Bit | Read Threshold | Test Type | Error Threshold |
|---|---|---|---|---|---|---|
| Low Wear State | 0 | 0 | 0 | Default | BGMS | th_ecc_0 |
| Possibly Medium Wear State | 1 | 0 | 0 | Default | CAW | th_ecc_CAW_0 |
| Medium Wear State | 0 | 1 | 0 | Non-Default (Optimal) | BGMS | th_ecc_1 |

TABLE 1-continued

States from FIG. 3

| State Name | CF Bit | DF Bit | EOL Bit | Read Threshold | Test Type | Error Threshold |
|---|---|---|---|---|---|---|
| Possibly High Wear State | 1 | 1 | 0 | Non-Default (Optimal) | CAW | th_ecc_CAW_1 |
| High Wear State | 0 | 1 | 1 | Non-Default (Optimal) | BGMS | th_ecc_2 |
| Retired State | 1 | 1 | 1 | N/A | N/A | N/A |

The state machine begins at low wear state 300 where CF=0, DF=0, and EOL=0. For the purposes of explanation, suppose that there is one storage controller component (not shown) which performs BGMS testing and another storage controller component (not shown) which performs CAW testing on the various groups of cells in solid state storage. In this example, the BGMS component performs BGMS testing on a given group of cells (e.g., periodically) if the corresponding CF bit is 0 and does not perform BGMS testing if CF=1. Conversely, if CF=1 then the CAW component performs CAW testing on the corresponding group of cells (with the exception of retire block state 310, during which no testing is performed) but does not perform CAW testing if CF=0. As such, BGMS testing is performed (e.g., periodically) on a group of cells in low wear state 300.

As is shown in Table 1, the read threshold used in low wear state 300 is a default read threshold and the error threshold is th_ecc_0. As such, the BGMS test in low wear state 300 includes reading the given group of cells using the default threshold, performing error correction decoding on the read data to obtain a number of bit errors, and comparing the number of bit errors to th_ecc_0. If the number of bit errors is greater than or equal to error threshold th_ecc_0, then BGMS fails; if not, BGMS passes.

If the BGMS passes in low wear state 300, then the group of cells remains in low wear state 300. However, if the BGMS fails, then the group of cells goes to possibly medium wear state 302. As is shown in Table 1, going from low wear state 300 to possibly medium wear state 302 causes the CF bit to be set.

Possibly medium wear state 302 is so named because a group of cells in that state may or may not be worn out to a medium degree (i.e., the electrical insulation may or may not be worn out to a medium degree, meaning that a group of cells in that state may leak charge to a medium degree). Since CF=1, the CAW test (e.g., described in FIG. 1) is performed on the group of cells. In this particular application, the CAW process sorts groups of cells in possibly medium wear state 302 into low wear state 300 or medium wear state 304. In this example at least, a write which is used in the CAW test is a host-initiated write, meaning that the CAW test will wait (e.g., opportunistically) until a host write directed to the group of cells in question is received before performing the CAW test.

As is shown in Table 1, in possibly medium wear state 302, the read threshold is a default threshold and the error threshold is th_ecc_CAW_0. As such, the CAW test in this state includes reading the group of cells of interest using the default threshold, performing error correction decoding on the read data to obtain a number of bit errors, and comparing the number of bit errors to th_ecc_CAW_0. If the number of bit errors is greater than or equal to th_ecc_CAW_0 then CAW fails and the group of cells goes to medium wear state 304 (where CF is reset to 0 and DF is set to 1). If the number of bit errors is less than th_ecc_CAW_0 then CAW passes and the group of cells goes to low wear state 300 (where CF is reset to 0).

Regarding the transition from possibly medium wear state 302 to medium wear state 304, in this case the default read threshold is no longer capable of returning read data which is sufficiently error free (e.g., even if the read is conducted immediately or otherwise soon after writing the data). Thus, simply moving the data to another location will not alleviate this situation, as the next time data is written into the worn location a similar occurrence is likely to happen. This would lead to excessive and/or repeated refreshes, which degrade the performance of the drive and add unnecessary P/E cycles to the solid state storage. Therefore, the optimal read threshold (or some other non-default read threshold which returns fewer bit errors than the default read threshold) is to be used going forward.

The DF bit is used to track which read threshold to use during a particular test (e.g., BGMS or CAW). If DF=0, then a default threshold is used during the read. However, if DF=1, then the default read threshold is no longer sufficient (because too many bit errors would be returned) and a non-default read threshold that returns fewer errors than the default read threshold is used (e.g., the optimal read threshold which returns the fewest bit errors of all possible read thresholds).

In medium wear state 304, CF=0 and DF=1. As a result of the former, BGMS testing is performed (as opposed to CAW testing) and the latter causes a non-default (e.g., optimal) read threshold to be used. As such, the BGMS test in medium wear state 304 includes reading the group of cells of interest using a non-default threshold, performing error correction decoding on the read data to obtain a number of bit errors, and comparing the number of bit errors to th_ecc_1. If the BGMS passes, then the group of cells stays in medium wear state 304. If the BGMS fails, then the group of cells goes to possibly high wear state 306 (where CF is set to 1).

In possibly high wear state 306, CF=1 and DF=1 so CAW testing is performed using a non-default read threshold. As before, the write used in the CAW test is a host-initiated write, so the CAW process waits until a host write is received for the group of cells of interest. The test threshold in this state is th_ecc_CAW_1 so if the number of bit errors is greater than or equal to th_ecc_CAW_1, the group of cells goes to high wear state 308 (where CF is reset to 0 and EOL is set to 1). Otherwise, the group of cells goes back to medium wear state 304 (where CF is reset to 0).

In high wear state 308, the group of cells is so worn that even a non-default read threshold will return too many bit errors. As such, when the BGMS fails (using a non-default read threshold and the test threshold th_ecc_2), the group of cells goes to retired state 310. In retired state 310, the data which is stored in that location is moved to another location (which is not in retired state 310) and the location is no longer used to store data. For example, a mapping table (which tracks logical to physical address mappings) may be updated so that the worn location in the retired state can no longer be mapped to by any logical address.

As is shown in this example, the BGMS test is used to identify groups of cells on which to perform CAW testing. It is also noted that any group of cells which fails BGMS testing (e.g., in low wear state 300, medium wear state 304, or high wear state 308) is refreshed by moving the data to a new location. A given location or group of cells is not retired, however, until it is in retired state 310.

In some embodiments, th_ecc_CAW_0 is not greater than th_ecc_0 and/or th_ecc_CAW_1 is not greater than th_ecc_1, since after a refresh (e.g., triggered by failing BGMS testing) the number of bit errors returned from that group of cells is expected to improve.

One benefit to the state machine shown in FIG. 3 (and, more generally, to the CAW process shown in FIG. 1) is that it extends the lifetime of the system. Instead of proceeding straight to retirement of the group of cells, the lifetime of a given group of cells is extended by switching from a default read threshold to an optimal read threshold (or, more generally, a non-default read threshold) before retirement of the group of cells. This acts to extend the lifetime of the system.

Figure 4:
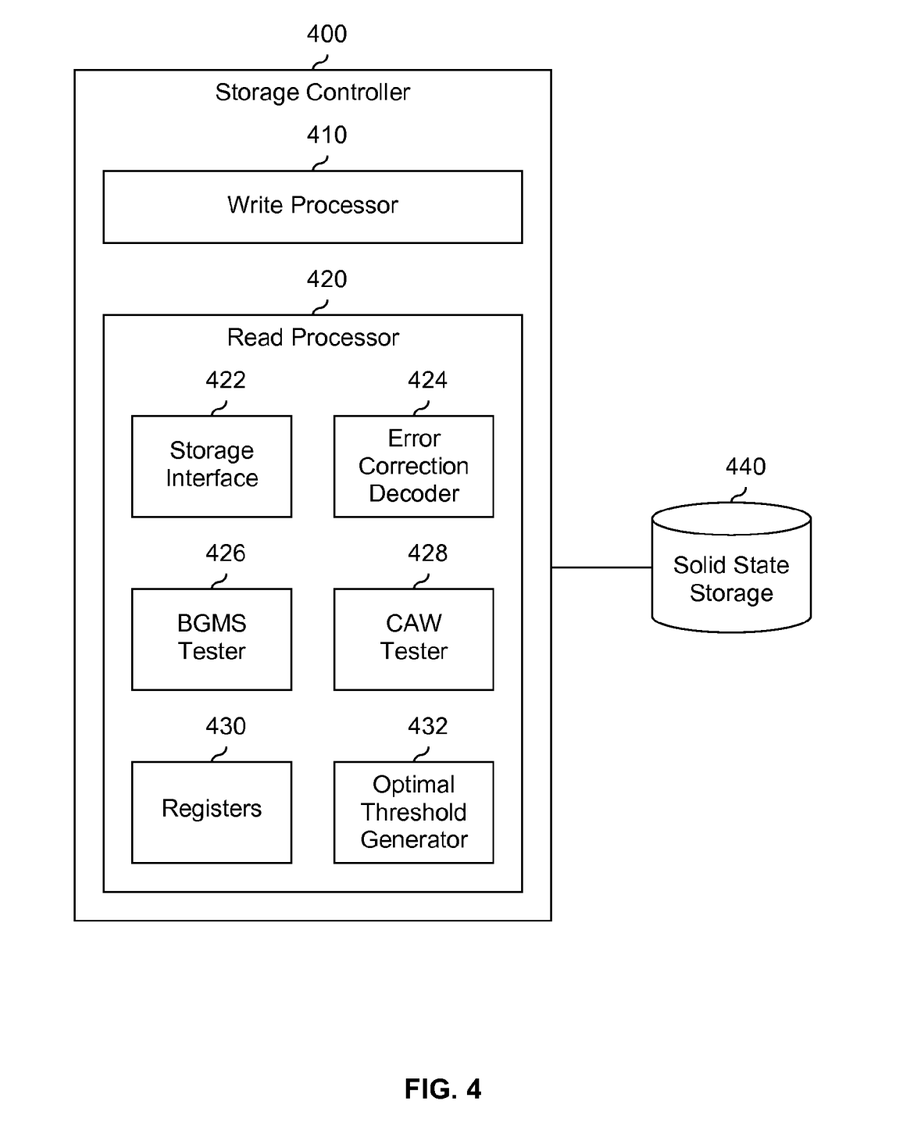
FIG. 4 is a diagram illustrating an embodiment of a system which performs BGMS and CAW testing.

FIG. 4 is a diagram illustrating an embodiment of a system which performs BGMS and CAW testing. In the example shown, storage controller 400 uses the process of FIG. 1 to perform BGMS and CAW testing on solid state storage 440 where each of the groups of cells in solid state storage 440 progresses independently through the state machine described in FIG. 3 and Table 1. In this example, storage controller 400 is a semiconductor device, such as an application-specific integrated circuit (ASIC) or a field-programmable gate array (FPGA). In some embodiments, solid state storage 440 comprises NAND Flash. For readability, some components which are not related to the CAW process of FIG. 1 or the state machine shown in FIG. 3 and Table 1 are not shown herein.

In this example, a write associated with a CAW test is a host-initiated write. As such, when a write from a host (not shown) is received, the state bits CF, DF, and/or EOL in registers block 430 corresponding to the write address(es) are examined to determine if a CAW test is desired for those write address(es). If so, the system waits the specified amount of time and then performs the CAW test. In the example of FIG. 4, the write is performed by write processor 410.

Storage interface 422 in read processor 420 interfaces with solid state storage 440. In the event a default threshold is used to perform a read of solid state storage 440, the default threshold is obtained from registers 430. In the event an optimal read threshold (or, more generally, a non-default threshold) is used to perform the read, optimal threshold generator 432 is used. For example, optimal threshold generator 432 may access solid state storage 440 through storage interface 422 and provide to error correction decoder 424 the read data with the fewest bit errors (i.e., it may not be possible to remove all bit errors merely by adjusting the read threshold).

The read data is passed from storage interface 422 to error correction decoder 424 which performs error correction decoding on the read-back data. The decoding results (e.g., success/fail and if successful, the number of bit errors) are passed from error correction decoder 424 to either BGMS tester 426 or CAW tester 428 depending upon what test is being performed (e.g., depending upon what state a given group of cells is in). See, for example, the test type column in Table 1. If error correction decoder 424 is able to successfully decode the read data, then the appropriate tester (i.e., BGMS tester 426 or CAW tester 428) compares the number of bit errors to the appropriate error threshold depending upon the state bits. See, for example, the error threshold column in Table 1. If decoding is unsuccessful, then a failure is declared for the BGMS test or CAW test (at least in this example). Depending upon the BGMS test results or CAW test results, the state bits in registers 430 are updated accordingly by BGMS tester 426 or CAW tester 428. See, for example, the state transitions shown in FIG. 3.

Registers block 430 in read processor 420 is used to store the state bits CF, DF, and EOL. In various embodiments, registers 430 may also include a variety of test related parameters which may be configured as desired. Table 2 gives some examples of test related parameters which may be stored in registers 430.

TABLE 2

Example test related parameters

| Parameter Name | Parameter Description |
| --- | --- |
| BGMS_cycle (BGMS) | BGMS testing runs periodically in the background on all written superblocks (i.e., excluding any empty superblocks). Once all of the pages in all of the written superblocks have been checked, BGMS testing pauses. The next BGMS cycle starts after the amount of time specified by BGMS_cycle, as measured from the start of one BGMS cycle to the start of the next BGMS cycle. |
| n_pages (BGMS) | When a given superblock is checked, one or more pages are selected from each block in the superblock. The number of pages selected per block is specified by n_pages. In some embodiments, it is not necessary for the selected pages to be valid pages since reliability is being checked for. To put it another way, BGMS is a physical address-based scan, not a logical address-based scan. |
| sblk_per_seg (BGMS) | If desired, a single BGMS cycle can be divided into multiple segments in order to save power. To put it another way, it is not necessary to check all pages of all written superblocks in a single pass and/or in an uninterrupted manner. sblk_per_seg specifies the number of superblocks checked per segment. |
| segment gap (BGMS) | This parameter specifies the time gap between two segments in BGMS testing, as measured from the start of one segment to the start of the next segment. |
| check delay (CAW) | This parameter specifies the amount of time between writing to a superblock and testing that superblock using the CAW test. For example, if check_delay = 0 then the CAW test is an immediate check after write (ICAW) test where no time elapses between writing to a block and performing the CAW test on that block. |

The following figure gives an example of a testing sequence for BGMS testing. In some embodiments, blocks (pages) are tested in the following manner and any blocks (pages) which fail BGMS testing are flagged for CAW testing (some examples of which are described above).

Figure 5:
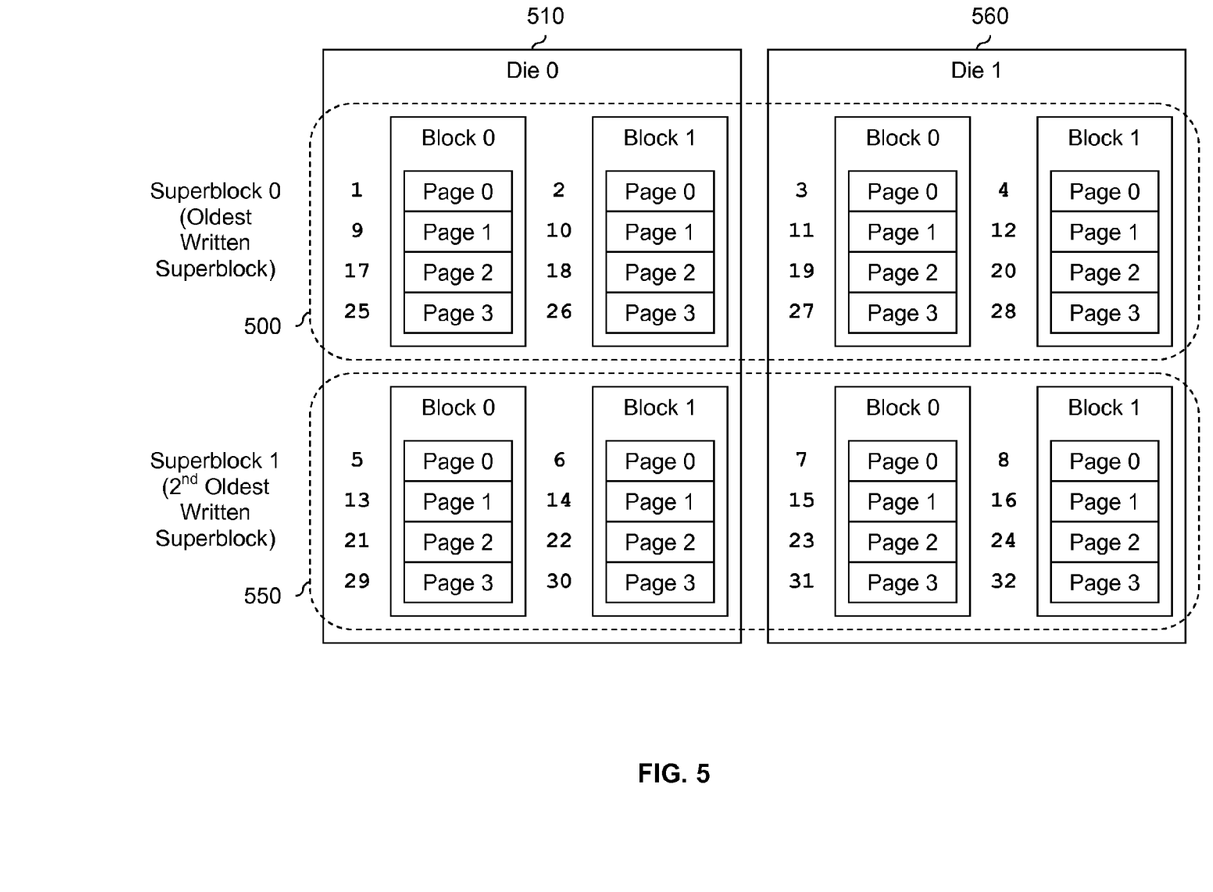
FIG. 5 is a diagram illustrating an embodiment of pages in superblocks which are tested by a BGMS test.

The following figure shows an example of a sequence of pages tested by a BGMS test.

FIG. 5 is a diagram illustrating an embodiment of pages in superblocks which are tested by a BGMS test. In the example shown, there are two superblocks (500 and 550). Each superblock includes four blocks, two of which are on a first semiconductor die (510) and the other two of which are on a second semiconductor die (560). Each block contains four pages. The number of pages per block, number of dies, number of superblocks, and such shown in this figure are merely exemplary and is not intended to be limiting.

In this example, blocks in solid state storage are grouped into superblocks, where (at least in this example) a superblock is the smallest unit of erasing and refreshing. As such, the P/E counts of all blocks in the same superblock are equal over the lifetime of the solid state storage. This system also records the order in which superblocks are programmed. As such, it is known that the first superblock (500) is the oldest written superblock and the second superblock (550) is the second oldest written superblock.

In this example, the test parameter n_pages=1 and so only 1 page is selected from each block in each superframe before moving on to the next block within a given superframe. The order in which pages are tested by a BGMS tester are shown next to each page. First, the oldest written superblock (500) is tested by selecting and testing a single page from each block: (Superblock 0, Die 0, Block 0, Page 0), (Superblock 0, Die 0, Block 1, Page 0), (Superblock 0, Die 1, Block 0, Page 0), and (Superblock 0, Die 1, Block 1, Page 0). Then, superblock (550) is tested: (Superblock 1, Die 0, Block 0, Page 0), (Superblock 1, Die 0, Block 1, Page 0), (Superblock 1, Die 1, Block 0, Page 0), and (Superblock 1, Die 1, Block 1, Page 0). The BGMS tester then returns to superblock 500: (Superblock 0, Die 0, Block 0, Page 1), (Superblock 0, Die 0, Block 1, Page 1), (Superblock 0, Die 1, Block 0, Page 1), and (Superblock 0, Die 1, Block 1, Page 1). This sequence continues until all pages in superblocks 500 and 550 have been tested. Note that any pauses or breaks (e.g., in order to save power or not impede other accesses to solid state storage) are not shown in this example.

In this example, superblocks are tested in the order in which they are written so that the oldest written superblock is tested first and the most recently written superblock is tested last. This may be attractive because superblocks which are written earlier may have more retention than those which are written later. As described above, retention is a problem which occurs when a group of solid state storage cells sits for too long without being refreshed.

In this example, pages from different superblocks are interleaved. For example, pages from superblock 500 are BGMS tested, then pages from superblock 550 are BGMS tested, then the test goes back to pages from superblock 500, and so on. In some applications, interleaving pages from different superblocks is attractive because it is a quick way to sample the entire drive in a relatively thorough manner. For example, pages in a block tend to be assigned to the same area within a die. As such, there is little manufacturing or process difference within a given block. BGMS testing of one or more pages (but not all pages) within each block in a superblock is thus a quick and effective way of testing since the selected pages from a block are a good representation of the state of the entire block since there is little variation across a given block.

Although the foregoing embodiments have been describe in some detail for purposes of clarity of understanding, the invention is not limited to the details provided. There are many alternative ways of implementing the invention. The disclosed embodiments are illustrative and not restrictive.

What is claimed is:

1. A system, comprising:
   a write processor configured to program a group of one or more solid state storage cells;
   a storage interface configured to, a predetermined amount of time after the group of solid state storage cells is programmed, read the group of solid state storage cells to obtain read data;
   an error correction decoder configured to perform error correction decoding on the read data;
   a check after write (CAW) tester configured to assess the group of solid state storage cells for wear related degradation based at least in part on the error correction decoding; and
   a background media scan (BGMS) tester configured to perform BGMS testing on the group of solid state storage cells, wherein
   in a first state:
      the storage interface is configured to read the group of solid state storage cells using a default read threshold; and
      the BGMS tester is configured to test the group of solid state storage cells;
   in a second state:
      the storage interface is configured to read the group of solid state storage cells using a default read threshold; and
      the CAW tester is configured to test the group of solid state storage cells;
   in a third state:
      the storage interface is configured to read the group of solid state storage cells using a non-default read threshold; and
      the BGMS tester is configured to test the group of solid state storage cells; and
   in a fourth state:
      the storage interface is configured to read the group of solid state storage cells using a non-default read threshold; and
      the CAW tester is configured to test the group of solid state storage cells.

2. The system of claim 1, wherein a read threshold, which is used to read the group of solid state storage cells, is selected from a group which includes a default read threshold and a non-default read threshold based at least in part on one or more state bits.

3. The system of claim 1, wherein in the event the error correction decoder is able to successfully decode the read data:
   the CAW tester compares a number of bit errors, output by the error correction decoder, against a test threshold; and
   the test threshold is selected based at least in part on one or more state bits.

4. The system of claim 1, wherein:
   in the first state, in the event the error correction decoder is able to successfully decode the read data, the BGMS tester is configured to compare a number of bit errors, output by the error correction decoder, against a first test threshold;
   in the second state, in the event the error correction decoder is able to successfully decode the read data, the CAW tester is configured to compare a number of bit errors, output by the error correction decoder, against a second test threshold;
   in the third state, in the event the error correction decoder is able to successfully decode the read data, the BGMS tester is configured to compare a number of bit errors, output by the error correction decoder, against a third test threshold;
   in the fourth state, in the event the error correction decoder is able to successfully decode the read data, the CAW tester is configured to compare a number of bit errors, output by the error correction decoder, against a fourth test threshold; and
   in a fifth state:
      the storage interface is configured to read the group of solid state storage cells using a non-default read threshold;
      the BGMS tester is configured to test the group of solid state storage cells; and
      in the event the error correction decoder is able to successfully decode the read data, the BGMS tester is configured to compare a number of bit errors, output by the error correction decoder, against a fifth test threshold.

5. The system of claim 1, wherein the system includes a semiconductor device, including one or more of the following: an application-specific integrated circuit (ASIC) or a field-programmable gate array (FPGA).

6. A method, comprising:
programming a group of one or more solid state storage cells;
a predetermined amount of time after the group of solid state storage cells is programmed, reading the group of solid state storage cells to obtain read data;
using an error correction decoder to perform error correction decoding on the read data;
assessing the group of solid state storage cells for wear related degradation based at least in part on the error correction decoding; and
performing background media scan (BGMS) testing on the group of solid state storage cells, wherein
in a first state:
reading the group of solid state storage cells includes using a default read threshold; and
the group of solid state storage cells is BGMS tested;
in a second state:
reading the group of solid state storage cells includes using a default read threshold; and
the group of solid state storage cells is assessed for wear related degradation based at least in part on the error correction decoding;
in a third state:
reading the group of solid state storage cells includes using a non-default read threshold; and
the group of solid state storage cells is BGMS tested; and
in a fourth state: reading the group of solid state storage cells includes using a non-default read threshold; and
the group of solid state storage cells is assessed for wear related degradation based at least in part on the error correction decoding.

7. The method of claim 6, wherein a read threshold, which is used to read the group of solid state storage cells, is selected from a group which includes a default read threshold and a non-default read threshold based at least in part on one or more state bits.

8. The method of claim 6, wherein in the event the error correction decoder is able to successfully decode the read data:
assessing includes comparing a number of bit errors, output by the error correction decoder, against a test threshold; and
the test threshold is selected based at least in part on one or more state bits.

9. The method of claim 6, wherein:
in the first state, in the event the error correction decoder is able to successfully decode the read data, BGMS testing includes comparing a number of bit errors, output by the error correction decoder, against a first test threshold;
in the second state, in the event the error correction decoder is able to successfully decode the read data, assessing includes comparing a number of bit errors, output by the error correction decoder, against a second test threshold;
in the third state, in the event the error correction decoder is able to successfully decode the read data, BGMS testing includes comparing a number of bit errors, output by the error correction decoder, against a third test threshold;
in the fourth state, in the event the error correction decoder is able to successfully decode the read data, assessing includes comparing a number of bit errors, output by the error correction decoder, against a fourth test threshold; and
in a fifth state:
reading the group of solid state storage cells includes using a non-default read threshold;
the group of solid state storage cells is BGMS tested; and
in the event the error correction decoder is able to successfully decode the read data, BGMS testing includes comparing a number of bit errors, output by the error correction decoder, against a fifth test threshold.

10. The method of claim 6, wherein the method is performed by a semiconductor device, including one or more of the following: an application-specific integrated circuit (ASIC) or a field-programmable gate array (FPGA).

11. A computer program product, the computer program product being embodied in a non-transitory computer readable storage medium and comprising computer instructions for:
programming a group of one or more solid state storage cells;
a predetermined amount of time after the group of solid state storage cells is programmed, reading the group of solid state storage cells to obtain read data;
performing error correction decoding on the read data;
assessing the group of solid state storage cells for wear related degradation based at least in part on the error correction decoding; and
performing background media scan (BGMS) testing on the group of solid state storage cells, wherein
in a first state:
the computer instructions reading the group of solid state storage cells include computer instructions for using a default read threshold; and
the group of solid state storage cells is BGMS tested;
in a second state:
the computer instructions for reading the group of solid state storage cells include computer instructions for using a default read threshold; and
the group of solid state storage cells is assessed for wear related degradation based at least in part on the error correction decoding;
in a third state:
the computer instructions for reading the group of solid state storage cells include computer instructions for using a non-default read threshold; and
the group of solid state storage cells is BGMS tested; and
in a fourth state:
the computer instructions for reading the group of solid state storage cells include computer instructions for using a non-default read threshold; and
the group of solid state storage cells is assessed for wear related degradation based at least in part on the error correction decoding.

12. The computer program product of claim 11, wherein a read threshold, which is used to read the group of solid state storage cells, is selected from a group which includes a default read threshold and a non-default read threshold based at least in part on one or more state bits.

13. The computer program product of claim 11, wherein in the event the read data is able to be successfully decoded:
the computer instructions for assessing include computer instructions for comparing a number of bit errors, output by the error correction decoder, against a test threshold; and
the test threshold is selected based at least in part on one or more state bits.

14. The computer program product of claim 11, wherein:
in the first state, in the event the read data is able to be successfully decoded, the computer instructions for BGMS testing include computer instructions for comparing a number of bit errors, output by the error correction decoder, against a first test threshold;

in the second state, in the event the read data is able to be successfully decoded, the computer instructions for assessing include computer instructions for comparing a number of bit errors, output by the error correction decoder, against a second test threshold;

in the third state, in the event the read data is able to be successfully decoded, the computer instructions for BGMS testing include computer instructions for comparing a number of bit errors, output by the error correction decoder, against a third test threshold;

in the fourth state, in the event the read data is able to be successfully decoded, the computer instructions for assessing include computer instructions for comparing a number of bit errors, output by the error correction decoder, against a fourth test threshold; and in a fifth state:
  the computer instructions for reading the group of solid state storage cells include computer instructions for using a non-default read threshold;
  the group of solid state storage cells is BGMS tested; and
  in the event the read data is able to be successfully decoded, the computer instructions for BGMS testing include computer instructions for comparing a number of bit errors, output by the error correction decoder, against a fifth test threshold.

\* \* \* \* \*